(12) United States Patent
Shih et al.

(10) Patent No.: US 8,846,549 B2
(45) Date of Patent: Sep. 30, 2014

(54) METHOD OF FORMING BOTTOM OXIDE FOR NITRIDE FLASH MEMORY

(75) Inventors: Yen-Hao Shih, Changhua County (TW); Hang-Ting Lue, Hsinchu (TW); Erh-Kun Lai, Taichung County (TW); Kuang Yeu Hsieh, Hsin Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 2006 days.

(21) Appl. No.: 11/235,786

(22) Filed: Sep. 27, 2005

(65) Prior Publication Data
US 2007/0069283 A1    Mar. 29, 2007

(51) Int. Cl.
*H01L 21/31* (2006.01)
*G11C 16/04* (2006.01)
*H01L 21/28* (2006.01)
*H01L 29/51* (2006.01)

(52) U.S. Cl.
CPC ...... *H01L 21/28282* (2013.01); *G11C 16/0466* (2013.01); *H01L 29/513* (2013.01)
USPC .......................................... 438/783; 438/787

(58) Field of Classification Search
USPC ............... 257/E29.309, E21.18, E21.423, 257/E21.769, E21.21, E21.192; 438/783, 438/954, 591, 787
See application file for complete search history.

(56) References Cited

U.S. PATENT DOCUMENTS

| | | | |
|---|---|---|---|
| 6,190,973 B1 * | 2/2001 | Berg et al. ...................... 438/275 |
| 6,362,051 B1 | 3/2002 | Yang et al. | |
| 6,620,742 B2 | 9/2003 | Powell | |
| 6,638,877 B2 | 10/2003 | Rotondaro | |
| 6,689,645 B2 * | 2/2004 | Houng et al. ................ 438/143 |

* cited by examiner

*Primary Examiner* — Laura Menz
*Assistant Examiner* — Candice Y Chan
(74) *Attorney, Agent, or Firm* — Jianq Chyun IP Office

(57) ABSTRACT

A non-volatile memory device on a semiconductor substrate may include a bottom oxide layer over the substrate, a middle layer of silicon nitride over the bottom oxide layer, and a top oxide layer over the middle layer. The bottom oxide layer may have a hydrogen concentration of up to 5E19 $cm^{-3}$ and an interface trap density of up to 5E11 $cm^{-2}$ $eV^{-1}$. The three-layer structure may be a charge-trapping structure for the memory device, and the memory device may further include a gate over the structure and source and drain regions in the substrate.

5 Claims, 5 Drawing Sheets

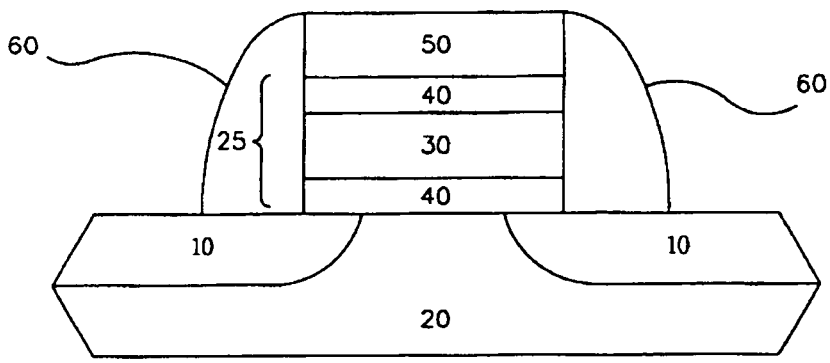
FIGURE 1(Prior Art)
| Cycles<br>Items | fresh | 1 | 10 | 100 | 1K | 10K | 100K |
|---|---|---|---|---|---|---|---|
| Sw (mV/dec) | 229.5 | 235.1 | 252.5 | 256 | 267 | 323.4 | 427 |
| Qit (coul/cm$^2$) | 0 | 4.48E-9 | 1.84E-8 | 2.12E-8 | 3.00E-8 | 7.5E-8 | 1.58E-7 |
| Vt by Qit (%) | 0 | 1.18 | 4.88 | 5.62 | 7.95 | 19.89 | 41.9 |
FIGURE 2(Prior Art)
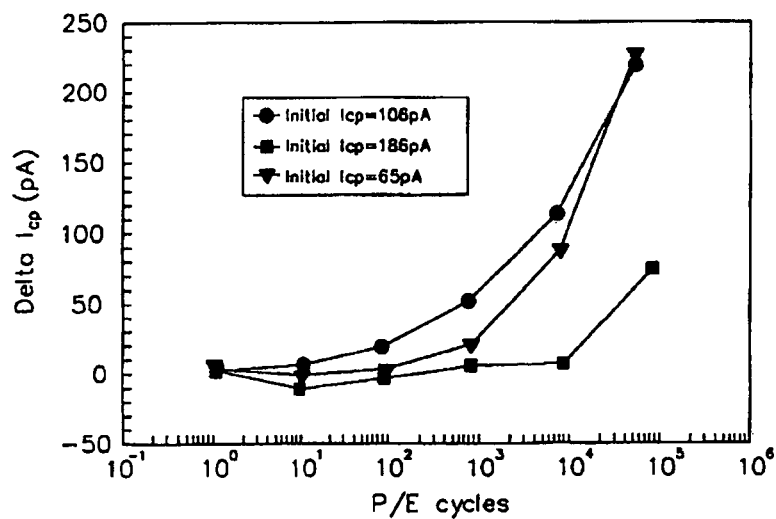
FIGURE 3(Prior Art)

Damaged interface and damaged BOX

Damaged interface ary system to which the invention may be applied. Alternatively, the device may be utilized in Different devices may also be applied.

METHOD OF FORMING BOTTOM OXIDE FOR NITRIDE FLASH MEMORY

BACKGROUND OF THE INVENTION

This disclosure relates generally to nonvolatile memory devices. More particularly, the present disclosure relates to nitride flash memory devices and methods for manufacture thereof.

Nonvolatile memory devices may have various structural designs. FIG. 1 shows an example of a nonvolatile memory cell that is implemented in and on a substrate. A memory cell may comprise source and drain regions 10, as well as a channel 20 disposed between the source and drain regions. Overlying channel is a charge-trapping or ONO structure 25, which may comprise a charge-trapping nitride layer 30 (e.g. silicon nitride) disposed between two oxide layers 40 (e.g. silicon oxide). Each memory cell may further comprise a gate electrode 50 that overlies the charge trapping structure 25. The charge-trapping structure 25 and the gate electrode 50 may be isolated from other structures on the substrate, such as source and drain contacts by spacers 60 shown in FIG. 1. By properly manipulating the relative voltages among source region, drain region and gate, it is possible to erase, store (or program) and read two separate bits of information in each memory cell.

A number of methods for forming the oxide and nitride layers of a non-volatile memory device are known. For example, U.S. Pat. No. 6,362,051 entitled "Method of Forming ONO Flash Memory Devices Using Low Energy Nitrogen Implantation," by Yang et al., discloses a method for fabricating a non-volatile memory device having a layer that contains a silicon nitride layer sandwiched between two silicon oxide layers.

In another example, U.S. Pat. No. 6,620,742 entitled "In-Situ Use of dichloroethene and $NH_3$ in an $H_2O$ Steam Based Oxidation System to Prevent a Source of Chlorine," by Powell, discloses a method for forming a semiconductor dielectric in the presence of strengthening and gettering agents. The method includes the simultaneous use of gaseous strengthening and gettering agents on a semiconductor dielectric, for example $NH_3$ in an $H_2O$ Steam Based Oxidation System.

In yet another example, U.S. Pat. No. 6,638,877, entitled "Ultra-Thin $SiO_2$ Using $N_2O$ as the Oxidant," by Rotondaro, discloses a structure and method of forming an ultra-thin oxide structure. In particular, an oxide layer is grown over a substrate using $N_2O$ and with the addition of hydrogen.

However, a number of concerns exist regarding known non-volatile memory devices and methods for manufacturing. For example, increases in interface trap densities (Dit) in a memory device may cause severe degradation of the device performance and adversely affect the operating life. Interface trap generation may occur as a device is cycled (continuous programming and erasing) causing current-voltage swing degradation and threshold voltage (Vt) shift. FIG. 2 shows the effect of write/erase cycles on I-V swing (Sw), interface trap charge (Qit), and Vt loss.

In one example, because of the interface trapped charges at the oxide/silicon interface, it is possible the actual amount of charges programmed into the charge-trapping structure 25 may be reduced by Qit. Therefore, only (PV-EV)*Cono)-Qit is programmed into the ONO structure, wherein PV stands for programming voltage, EV stands for erasing verify voltage, and Cono stands for the capacitance of the ONO structure. In some cases, high temperature baking may anneal the trap charge Qit, leading to equivalent Vt loss, which may be in the amount of Qit/Cono. As an example, the percentage of ONO charge loss caused by Qit is (Qit/(Cono*(PV-EV)))*100.

Interface traps may also be present in a fresh device. The amount of interface traps can cause a recombination current in charge pumping measurement, and the amount of recombination current is proportional to the amount of interface traps. FIG. 3 plots the change in charge pumping current (Icp), which is the recombination current from the interface traps, over the number of program/erase cycles of a nonvolatile memory device. The experimental data shown in FIG. 3 shows that a large initial Icp indicated a small Icp increase as a non-volatile memory device was cycled.

While high temperature baking may anneal interface traps, and annealing of interface traps may also contribute to Vt loss, which may result in data retention problems in a high temperature environment. FIG. 4 plots Vt versus time for a fresh device and a device that underwent 100,000 cycles at a temperature of 250° C. Experimental data showed that Vt loss was greater for the cycled device than for a fresh device in high temperatures.

Thus, a fresh non-volatile memory device with a large Dit is subject to a slower growth rate of Dit during cycling compared with a fresh device with a small Dit. Also, a fresh device with a low quality of bottom oxide (BOX) could not properly retain data in high temperature environments. Accordingly, it is desirable to have a non-volatile memory device with a large Dit, i.e., low quality interface, but with a high quality BOX.

BRIEF SUMMARY OF THE INVENTION

According to one aspect of the present disclosure, a non-volatile memory device with a top oxide layer, a bottom oxide layer; and a middle layer of silicon nitride over a semiconductor substrate is disclosed; wherein the bottom oxide layer is characterized by a concentration of hydrogen of up to 5E19 cm-3 and an interface trap density of up to 5E11 cm-2 eV-1.

According to another aspect of the disclosure, a method of producing a non-volatile memory device comprising a top oxide layer, a bottom oxide layer, and a middle layer of silicon nitride, over a semiconductor substrate, is disclosed. The method comprises the steps of: forming a bottom oxide layer over the semiconductor substrate; implanting atoms, for example at least one atom selected from N, O, Ar, B, As, P, In, F, and Sb through the bottom oxide layer and into the substrate; heating the semiconductor substrate at a temperature greater than 700° C.; and forming a middle layer of silicon nitride above the bottom oxide layer; and forming a top oxide layer above the middle layer.

According to yet another aspect of the disclosure, a method of forming a bottom layer of silicon oxide over a semiconductor substrate in a flash memory device is disclosed. The method comprises the steps of: heating the semiconductor substrate in an atmosphere containing oxygen to form a silicon oxide layer over the semiconductor substrate; implanting at least one atom selected from N, O, Ar, B, As, P, In, F, and Sb into the bottom oxide layer at an energy level of no more than 500 KeV; and heating the semiconductor substrate at a temperature greater than 700° C.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 1 shows a schematic diagram illustrating an exemplary structure of a nonvolatile memory cell;

FIG. 2 illustrates the effects of read/write cycles on the Sw, Qit, and Vt of a non-volatile memory device;

FIG. 3 illustrates the change in Icp over the number of program/erase cycles of a non-volatile memory device;

DETAILED DESCRIPTION OF THE INVENTION

Reference will now be made in detail to the exemplary embodiments of the invention, examples of which are illustrated in the accompanying drawings. Wherever possible, the same reference numbers will be used throughout the drawings to refer to the same.

The following exemplary methods and devices overcome one or more disadvantages of prior devices methods of forming memory devices. According to one embodiment, a non-volatile memory device comprising a top oxide layer, a bottom oxide layer; and a middle layer of silicon nitride over a semiconductor substrate. The bottom oxide layer may have a hydrogen concentration of up to 5E19 $cm^{-3}$ and an interface trap density of up to 5E11 $cm^{-2}$ $eV^{-1}$. In one particular example, the concentration of hydrogen may be between about 1E17 $cm^{-3}$ and about 5E19 $cm^{-3}$. In another example, the interface trap density may be between about 1E10 $cm^{-2}$ $eV^{-1}$ and about 5E11 $cm^{-2}$ $eV^{-1}$.

Figure 12:
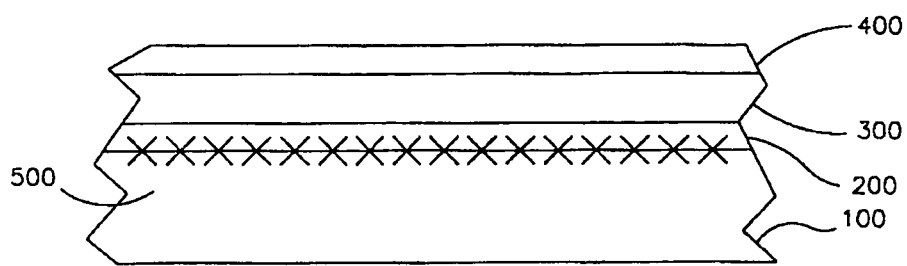
FIG. 12 shows a schematic diagram illustrating one example of a memory device according to an embodiment of the present disclosure.

FIG. 12 shows a schematic diagram illustrating one example of a memory device with a top oxide layer 400, a middle layer of silicon nitride 300, and a bottom oxide layer 200 over a substrate 100. Representative interface traps 500 are illustrated between the bottom oxide layer 200 and the substrate 100.

According to another embodiment, a bottom oxide layer is formed on or over a semiconductor substrate. The bottom oxide layer is then implanted with some atoms or ions. For example, the bottom oxide layer may be implanted with atoms or ions chosen from at least one of N (nitrogen), O (oxygen), Ar (argon), B (boron), As (arsenic), P (phosphorus), In (Indium), F (fluorine), and Sb (antimony) atoms or ions or any combination of them at an energy level no more than 500K eV. In another example, the ion implanting is conducted at an energy level is between 10 eV and 500K eV. The substrate and bottom oxide layer are then annealed. For example, the substrate may be annealed through a heating process with a temperature of or greater than 700° C. In another example, the substrate and bottom oxide layer are heated at a temperature between 700 and 1100° C. In one example, the resulting bottom oxide layer may have a hydrogen concentration of up to 5E19 $cm^{-3}$ and an interface trap density of up to 5E11 $cm^{-2}$ $eV^{-1}$. After heating, a middle layer of silicon nitride is formed above the bottom oxide layer. A top oxide layer is then formed above the middle layer. Additionally, one or more gate regions may also be formed after forming the top oxide layer. Additionally, one or more isolation regions may be formed after forming the gate regions.

Figure 9:
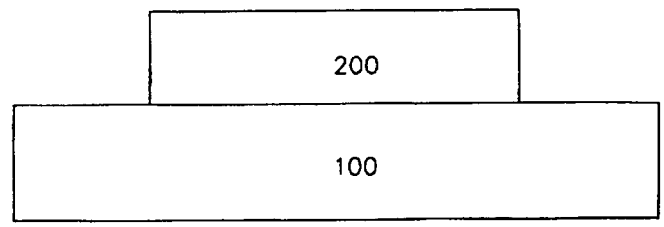
FIGS. 9-11 illustrate a process for forming a bottom oxide layer according to an embodiment of the present disclosure.
Figure 10:
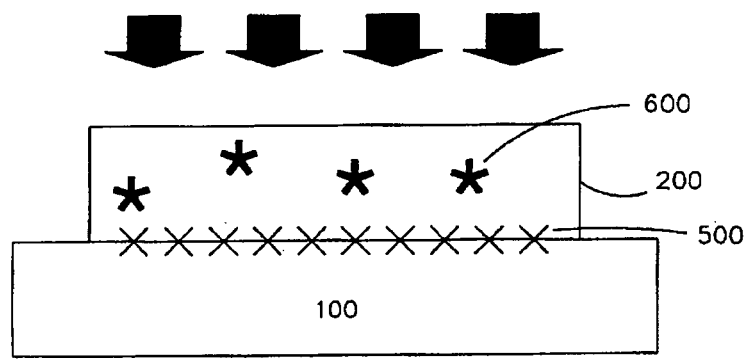
Figure 11:
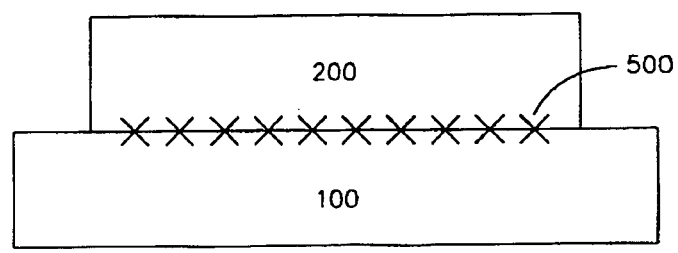

FIGS. 9-11 illustrate exemplary cross-sectional views of a method of forming a bottom oxide layer over a substrate according to one embodiment of the present disclosure. Referring to FIG. 9, a bottom oxide layer 200 may be formed over a substrate 100 with the implantation and anneal techniques described in the aforementioned examples. For example, referring to FIG. 10, the bottom oxide layer 200 is implanted with atoms or ions at a low energy level, for example, no more than 500K eV. The atoms or ions implanted may include one or more of ions chosen from. Due to the implantation, interface traps 500 may be formed, and damage 600 to the bottom oxide layer 200 may occur. The bottom oxide layer 200, the substrate 100, or both, are then annealed, such as by a heating process.

In one example, the heating may be done in an atmosphere comprising of one or more gases chosen from nitrogen, helium, or argon. FIG. 11 is a cross sectional diagram showing the resulting structure comprising a high quality bottom oxide layer 200 and large number of interface traps 500.

According to yet another embodiment of the disclosure, a bottom oxide layer 200 is formed over a semiconductor substrate 100. The bottom oxide layer is then implanted with atoms or ions selected from at least one of N, O, Ar, B, As, P, In, F, and Sb at a low energy level, for example, no more than 500K eV. The substrate and bottom oxide layer are then annealed, such as by heating them at a high temperature of or greater than 900° C. A middle layer of silicon nitride is then formed above the bottom oxide layer. A top oxide layer is then formed above the middle layer.

Figure 4:
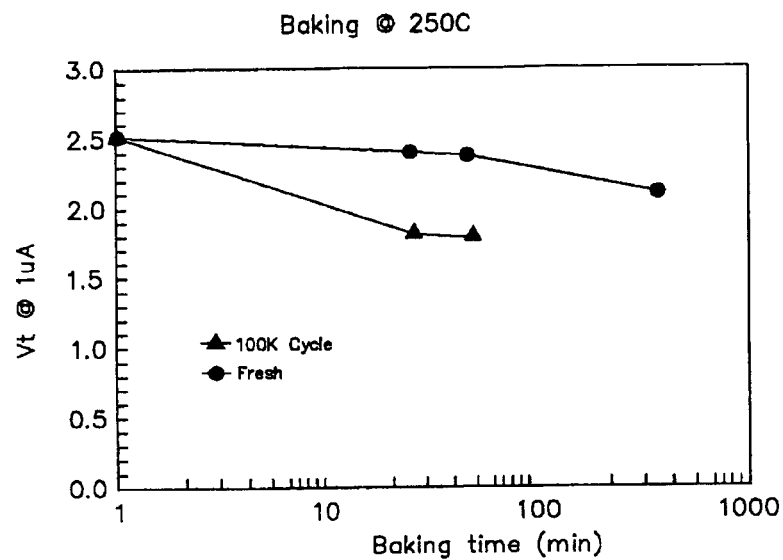
FIG. 4 plots Vt versus time for a fresh device and a device that underwent 100,000 cycles at a temperature of 250° C.
Figure 5:
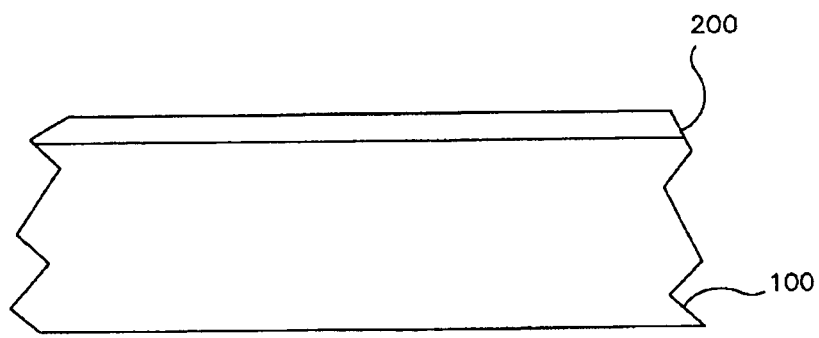
FIG. 5 shows a schematic diagram illustrating an exemplary structure of a bottom oxide layer formed over a substrate.
Figure 6:
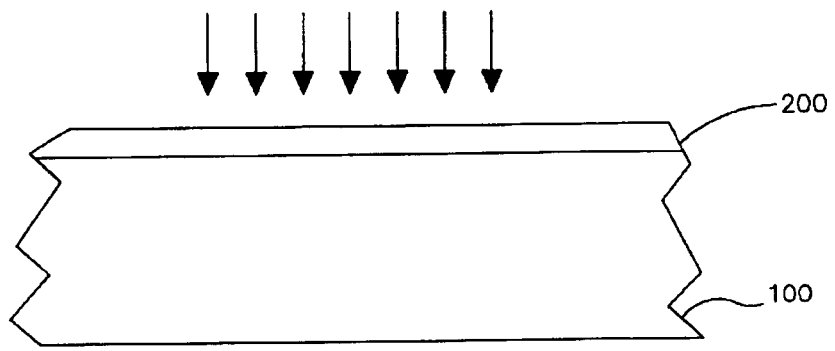
FIG. 6 shows a schematic diagram representing the implanting of ions through the bottom oxide layer into the substrate at a given energy level.
Figure 7:
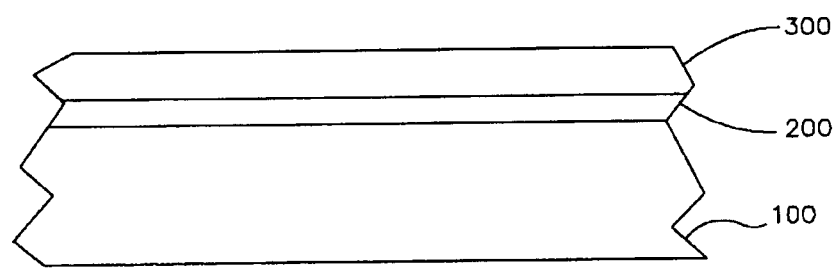
FIG. 7 shows a schematic diagram illustrating an exemplary structure of a middle nitride layer formed on a bottom oxide layer.
Figure 8:
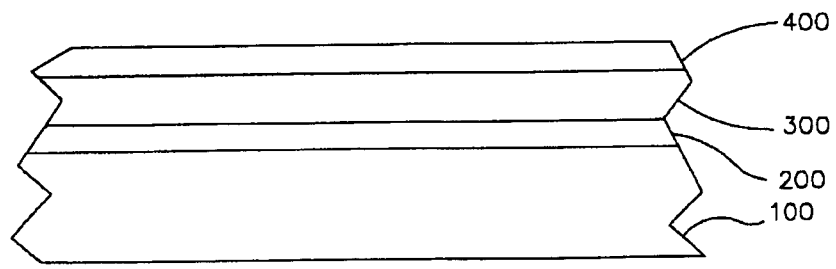
FIG. 8 shows a schematic diagram illustrating an exemplary structure of a top oxide layer formed on a middle nitride layer.

FIGS. 6-8 illustrate exemplary cross-sectional views of a method of forming the middle nitride layer and top oxide layers according to one embodiment of the present disclosure. FIG. 6 is a schematic view of a bottom oxide layer 200 formed over a substrate 100, which is subjected to ion implantation. After ion implantation, the bottom oxide layer and substrate are heated at a high temperature to anneal the bottom oxide layer. After heating, a middle nitride layer 300 is formed above the bottom oxide layer 200, as depicted in FIG. 7. A top oxide layer 400 is then formed above the middle nitride layer 300, as depicted in FIG. 8.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents. Additionally, in the foregoing disclosure, the terms "ions" and "atoms" have been used interchangeably and the use of one term is not meant to limit or distinguish the embodiment or description in any way.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A method of forming a bottom layer of silicon oxide over a semiconductor substrate in a flash memory device, the method comprising:

heating the semiconductor substrate in an atmosphere containing oxygen to form a silicon oxide layer over the semiconductor substrate;

implanting at least one atom selected from N, O, Ar, B, As, P, In, F, and Sb into the silicon oxide layer at an energy level of no more than 500K eV to form a plurality of interface traps; and heating the semiconductor substrate and the silicon oxide layer after the step of implanting the at least one atom into the silicon oxide layer at a temperature greater than 700.degree. C, wherein the silicon oxide layer has a hydrogen concentration of up to 5E19 $cm^{-3}$ and a large interface trap density that is maintained at between 7E10 and 5E11 $cm^{-2}$ $eV^{-1}$.

2. The method of claim 1 wherein the concentration of hydrogen is between 1E17 and 5E19 $cm^{-3}$.

3. The method of claim 1 wherein the at least one atom selected is As.

4. The method of claim 1 wherein the energy level s between 10 eV and 500 KeV.

5. The method of claim 1 wherein the semiconductor substrate having the bottom silicon oxide layer thereon is heated at a temperature between 700 and 1100° C.

* * * * *